United States Patent [19]

Blodgett

[11] Patent Number: 5,148,546
[45] Date of Patent: Sep. 15, 1992

[54] METHOD AND SYSTEM FOR MINIMIZING POWER DEMANDS ON PORTABLE COMPUTERS AND THE LIKE BY REFRESHING SELECTED DRAM CELLS

[76] Inventor: Greg A. Blodgett, 11135 Bridgetower Dr., Boise, Id. 83709

[21] Appl. No.: 836,536

[22] Filed: Feb. 19, 1992

Related U.S. Application Data

[63] Continuation of Ser. No. 689,163, Apr. 22, 1991, abandoned.

[51] Int. Cl.⁵ .............................................. G11C 14/00
[52] U.S. Cl. ..................................... 395/750; 365/222
[58] Field of Search ...................... 365/222; 358/903; 364/DIG. 1; 395/750

[56] References Cited

U.S. PATENT DOCUMENTS

| | | | |
|---|---|---|---|
| 3,751,582 | 8/1973 | Wernikoff et al. | 358/903 X |
| 4,357,686 | 11/1982 | Scheuneman | 365/222 |
| 4,459,660 | 7/1984 | Bellay et al. | 365/222 |
| 4,549,047 | 10/1985 | Brian et al. | 364/DIG. 1 X |
| 4,636,989 | 1/1987 | Ikuzaki | 365/222 |
| 4,977,537 | 12/1990 | Dias et al. | 365/222 |

OTHER PUBLICATIONS

MacIntosh/MacIntosh SE, 1987, pp. 111, 170, Apple Computer Inc. (Manual).

*Primary Examiner*—Michael R. Fleming
*Assistant Examiner*—C. Knoll
*Attorney, Agent, or Firm*—William J. Bethurum

[57] ABSTRACT

A system and method for minimizing power consumption in personal computers and for controlling the power requirements of a random access memory based upon the actual RAM requirements of given software application. Using this method and system, a predetermined number of rows of RAM storage capacity may be refreshed at any given time and at a controlled refresh frequency after a central processing unit has read a given software program to determine its data storage requirements. A novel RAM control system is connected between the output of the central processing unit and one or more inputs to the RAM storage stage and is operative in a novel manner to generate RAM row refresh signals to only a selected number of rows of memory cells within the random access memory stage.

11 Claims, 2 Drawing Sheets

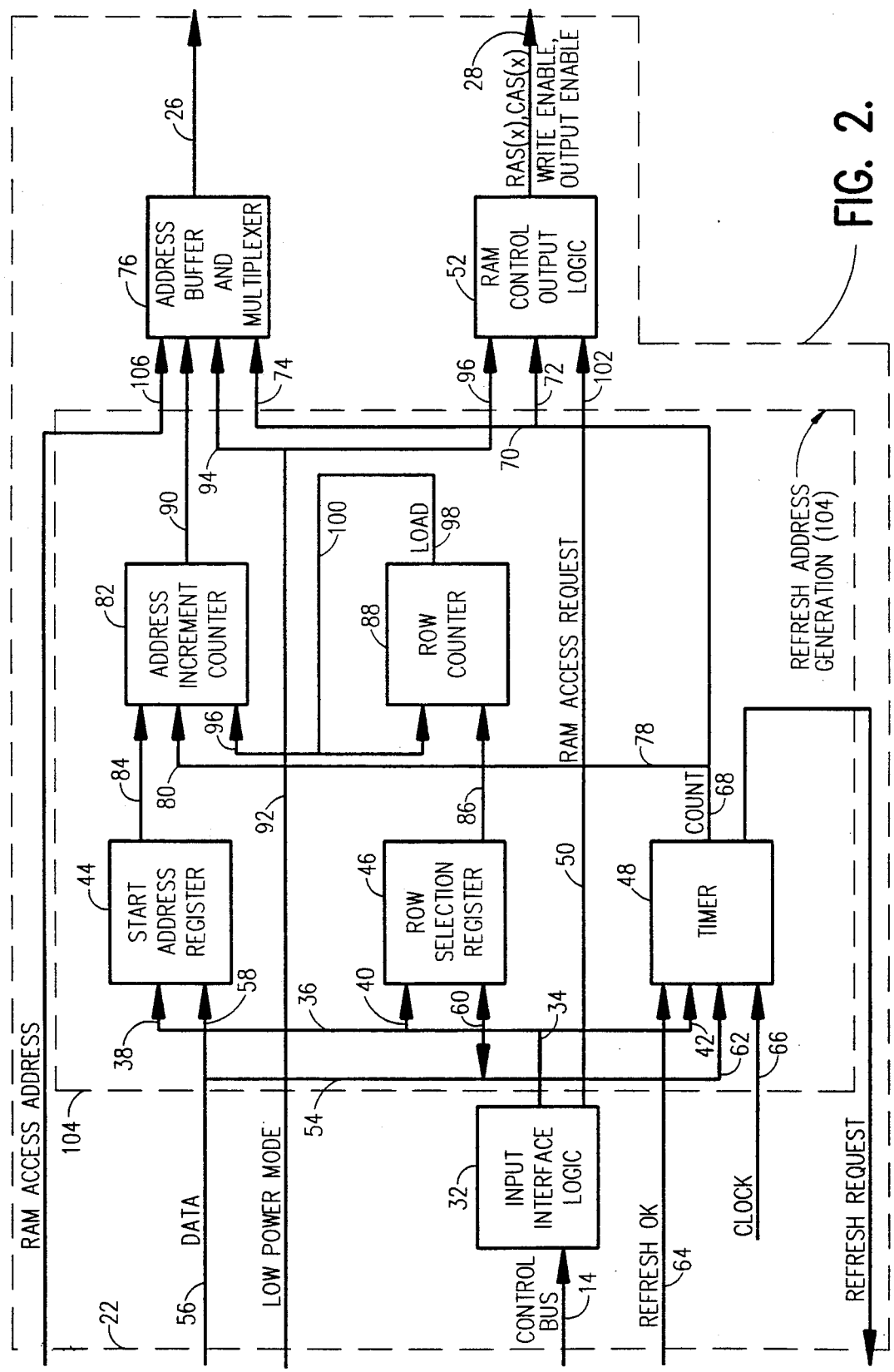

METHOD AND SYSTEM FOR MINIMIZING POWER DEMANDS ON PORTABLE COMPUTERS AND THE LIKE BY REFRESHING SELECTED DRAM CELLS

CROSS REFERENCE TO RELATED APPLICATION(S)

This application is a continuation of Ser. No. 689,163, filed on Apr. 22, 1991, now abandoned.

TECHNICAL FIELD

This invention relates generally to the conservation of power in computers and more particularly to reducing the operational power requirements for portable computers having a certain amount of random access memory (RAM) available therein. The invention described herein can be used in any computer system where dynamic random access memories (DRAMs) are used and may in some cases be used to replace static random access memories (SRAMs) as well.

BACKGROUND ART

Small portable computers having a fixed amount of RAM therein are often designed to operate from relatively small and conventional DC power supplies which have to be replaced at increasingly frequent intervals as the computational demands of these computers are increased. These computers normally contain a relatively large amount of RAM therein which is provided to handle the various computational demands of a wide variety of computer software programs. However, in actual practice and average daily use of these computers, only a small fraction of the RAM memory capacity is required by the majority of the computer programs used by a computer operator or at any given point in time such as between the use of applications.

In the past, in has been a common practice to maintain a sufficient DC power level to the RAM to maintain each and every memory storage cell or site therein active and in a data storage and retention mode regardless of the actual cell use. Many recently developed portable computers use a large number of stacked capacitor-type dynamic random access memories (DRAMs) where there is an integrated circuit storage capacitor associated with each memory storage cell and used for storing digital data in the integrated circuit memory chip. Thus, the periodic refresh power required to maintain the necessary stored charge on all of these capacitors and memory cells on the DRAM chip is quite significant when considering the large amount of data storage capacity that is available in these DRAM chips and required for certain types of software applications.

On the other hand, however, most software applications and programs require only a small percentage of the data storage capacity available in the DRAM chip, so that large amounts of power are wasted in refreshing the memory cells on the chip which are not used by these latter, most frequently used software applications. For example, certain types of Macintosh personal computers use up to 32 megabytes of RAM, and the power required to refresh this memory has been estimated to be about 11.2 watts. However, some of the system software used to run these computers uses only approximately 1 megabyte of this RAM, so that when no other applications or programs are running, the power required to maintain and preserve the contents of only the used memory could be reduced to 1/32nd of that previously required, or to 0.35 watts. In this example, a 15 ampere hour battery would last only about one hour with the full 32 megabytes of DRAM being refreshed, while it might last 20 or more hours in a standby mode with only 1 megabyte of DRAM being refreshed.

DISCLOSURE OF INVENTION

The general purpose and principal object of the present invention is to provide a new and improved method and system for substantially reducing the above power requirements for personal computers and thereby significantly increasing the lifetimes of the batteries used to power these computers.

Another object of this invention is to provide a new and improved method and system of the type described which are operative for controlling the power requirements of the computer RAM based upon the actual RAM data storage requirements at any given time, thereby imparting significant utility to a broad range of equipment applications, even though the greatest immediate beneficiary of this invention may be the portable computer.

Another object of this invention is to provide a new and improved method and system of the type described which may be implemented using a novel combination of commercially available hardware in a novel system organization. This system organization is highly compatible for operation with portable computers having relatively large amounts of dynamic random access memory therein.

Another object of this invention is to provide a new and improved method and system of the type described which is compatible for operation with many different types of software applications and programs.

Another object of this invention is to provide a new and improved method and system of the type described wherein random access memory refresh times have been substantially reduced and minimized, thereby also producing faster RAM access times and higher computational speeds and higher overall system performance as a result of the microprocessor therein being able to utilize instructions and data from its main memory at a faster rate than the memory could previously supply it.

A novel feature of this invention is the provision of a new and improved method and system of the type described wherein a refresh address signal generation subsystem may be provided either separate from the main RAM memory chip of the computer or as an integral part thereof. In case of the latter, by generating the refresh timing signals internal to the RAM, the overall power consumption of a computer system in the "sleep" mode can be substantially reduced inasmuch as there is no requirement to drive refresh circuitry in addition to the RAM itself. Moreover, the present invention significantly minimizes computer operating power requirements by limiting the frequency of refresh cycles performed on the chip itself and not refreshing unused memory locations thereon. A programmable timer can be included in the RAM refresh control system to alter not only the number of memory elements that will be refreshed, but also the refresh cycle frequency.

Another feature of this invention is the provision of a new and improved method and system of the type described which is adapted to allow the active memory array size within the computer to be varied in accordance with various power supply sources used, physical machine variations and different software configurations. In this manner, the present invention imparts maximum flexibility to a portable computer system with essentially no burden on the user inasmuch as the user does not have to install more RAM if he desires to run in a higher performance mode when power consumption is not an issue. Alternatively, the user does not have to remove RAM from the computer if the battery is to be used for an extended period of time. In addition, software utilities and hardware sensors can be used to automate much of the performance versus power optimization characteristic for a computer system using this invention.

Another feature of this invention is the provision of a new and improved method and system of the type described which is adapted for use with portable battery backed-up memory cards. A memory array on one of these cards can be designed with a rechargeable battery, and the data retention time of the card can be made dependent upon the amount of data actually stored on the card. When the card is plugged into a computer system, the battery can be recharged, or the battery can be recharged in an external card charger. When the RAM is empty, the card can then be carried around until it is needed. Once data is placed in the card, the expected lifetime of the data can be determined and known to the user who may desire to transport the data to another machine. This latter approach is similar to that of floppy disks, but the data storage density of these cards can be significantly greater than that of floppy disks Furthermore, the card power consumption may be made much less than that of floppy disks in accordance with the novel teachings of the present invention.

The above purpose, objects, novel features, and related advantages of the present invention are achieved herein by the provision of, among other things, a novel method and system for conserving power in the operation of small portable computers and the like having a relatively large amount of random access memory therein defined by a predetermined number of rows of memory elements. In accordance with the present method, a computer program is read or otherwise evaluated to ascertain how much RAM memory is required for its operation. Then, only a selected number of rows of memory cells in the RAM are refreshed at a controlled refresh frequency corresponding to the operational power level required to prevent any of the active cells in the RAM from losing data stored therein. When a second software program is to be subsequently used in place of the previous software program, the number of newly required or unnecessarily active rows of cells in the RAM are determined and are either added to or subtracted from the previous number of cell rows being refreshed in order to again match the memory requirements for the second software program precisely with the desired activated memory capability of the RAM.

In accordance with a system embodiment of the present invention, there is provided a central processing unit (CPU) and a main RAM storage stage, and RAM control means are connected between the CPU and the RAM storage stage and are responsive to input data signals received from the central processing unit for refreshing a controlled number of rows of memory cells or cites with said RAM stage as a function of data storage requirements of a software program or the like selected by the central processing unit.

The above computer system further includes means for receiving a selected portable read-only-memory (ROM) card and connected to the random access memory stage for loading data from the read-only-memory card into the random access memory stage during start-up of the computer system.

The computer system further includes an interface input logic stage connected to receive input data from the central processing unit, and a start address register and a row number selection register are connected to the output of the interface input logic stage for storing the number of rows within the RAM stage to be refreshed. A timer stage is connected to the output of the interface input logic stage for controlling the refresh frequency for the RAM stage, and an address increment counter and a row counter are each connected to the outputs of the start address register and the row number selection register, respectively, for generating output data useful for refreshing the RAM stage. If desired, the registers, timer, and counters noted above may be fabricated on the same integrated circuit chip that contains random access memory within the RAM stage.

The above computer system further includes an output address buffer multiplexing stage which is connected to the output of the address increment counter for providing RAM address data for application to the RAM stage. A RAM control output logic stage is connected to receive low power mode signals and output data from the input logic interface stage for generating row access strobe (RAS) signals and column access strobe (CAS) signals for application to the RAM control means.

The invention as summarized briefly above will become better understood with reference to the following description of the accompanying drawings.

BRIEF DESCRIPTION OF THE DRAWING

FIG. 2 is a subsystem diagram of the RAM control stage shown in FIG. 1, and it represents a preferred method and system embodiment of the present invention.

DETAILED DESCRIPTION OF THE DRAWINGS

Figure 1:
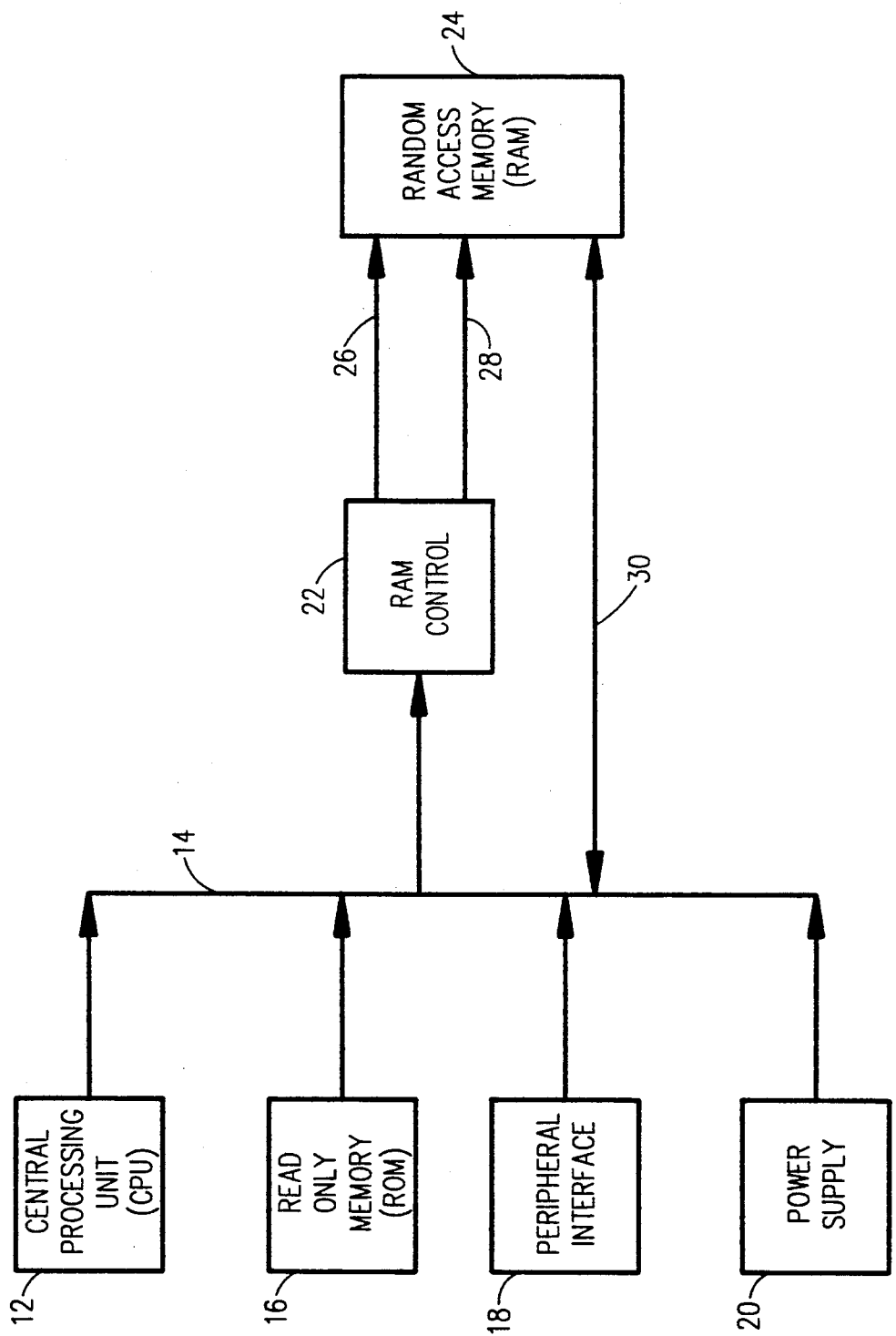
FIG. 1 is a functional block diagram of a computer operating system of the present invention.

Referring now to FIG. 1, the computer operating system shown therein is designated generally as 10 and includes a central processing unit (CPU) 12 which is connected to an interface bus 14 and is operative to pass data bidirectionally as indicated to and from the interface bus 14. The interface bus 14 will typically be connected to a read-only-memory (ROM) stage or card 16 which is used for initiating start-up operation in the system 10, and a peripheral interface stage 18 such as a printer, disk drive, keyboard, display, tape drive, modem or other peripheral device is connected as shown to pass data back and forth from the interface bus 14 in a well-known manner. A power supply 20 is also connected as shown to the interface bus 14, and it may be selectively controlled in order to provide variable power requirements to the computer system 10 under different operational conditions therein.

A random access memory (RAM) control subsystem 22 is connected as shown between the interface bus 14 and a random access memory (RAM) data storage stage 24 and is connected to drive the RAM memory stage 24 with an address line 26 and a control line 28 as indicated. In addition, a bypass data line or connector 30 is connected in parallel with the RAM control stage 22 and is operative to interconnect data directly back-and-forth between the central processing unit 12 and the RAM memory stage 24 as is common practice. However, the control and address signals still pass through the RAM control stage 22.

Referring now to FIG. 2, the RAM control subsystem 22 shown therein includes an input logic interface stage 32 which is driven by data on the control bus 14 at the output of the CPU 12. The logic interface stage 32 has one of its output lines 34 connected to an output bus line 36 which in turn is connected to the data inputs 38, 40, and 42. These latter inputs are connected, respectively, to a start address register 44, a row selection register 46, and a timer 48. The other output line 50 from the input logic interface stage 32 is connected as one input to a RAM control output logic interface stage 52 which is in turn connected via multiple control output lines 28 as multiple inputs to the RAM memory stage 24.

Another multiple input data line 56 is connected as shown to drive a second data bus 54 feeding three parallel connected multiple data output lines 58, 60, and 62 connected, respectively, as second inputs to the two registers 44 and 46 and to the timer stage 48. The timer stage 48 is further connected to a refresh OK data line 64 and to a clock line 66, and the output data line 68 from the timer stage 48 is connected by way of an output data bus 70 to drive one input 72 to the RAM output interface logic 52 and another input 74 to an address buffer multiplex stage 76 to be further described. The output data line 68 from the timer stage 48 is further connected by way of another data line 78 as one input 80 to an address increment counter 82. The functional connections 54, 56, 58, 60, and 62 above represent multiple data lines such as for example eight data lines from an eight, sixteen or thirty-two bit data bus.

The output data lines 84 and 86 from the start address register 44 and the row selection register 46, respectively, are connected as shown to drive the address increment counter 82 and a memory row counter 88, the purpose and operation for which are described below. The multiple output data lines 90 from the address increment counter 82 are connected as another data input to the address buffer multiplex stage 76, and a low power mode data input line 92 is connected to the two data input lines 94 and 96 to the multiplexer and output logic interface stages 76 and 52, respectively. The address increment counter 82 has its other input data line 96 connected to receive an output signal on line 98 from the row counter 88, and the output data line 98 from the row counter 88 is connected by way of a feedback loop 100 as a second input to the row counter 88. The counting function of the row counter 88 is controlled in the manner described below and performs its counting function in conjunction with and in combination with the address increment counter 82.

Referring again to FIG. 2, the RAM control subsystem shown in this figure will initially be described in broad functional terms and then followed by a specific operational and count down example for refreshing only a predetermined fraction of memory cells within the random access memory 24. In this functional block diagram, the control bus 14 is utilized to interconnect the output of the CPU 12 to the input interface logic stage 32, and the data line 56 derives its input data signals from the control bus 14 as well. The control bus 14 will typically have address lines, data lines, and control lines therein. For example, a microprocessor within the CPU 12 might, for example, have 16, 20, or 32 address lines, 16 or 32 data lines, and then a number of control lines which serve to define the activity on the control bus 14. If the CPU 12 is writing data into the memory stage 24, then the CPU 12 will generate an address signal, a data signal, and a write pulse, and these are the three basic types of signals that the control bus 14 transmits.

The function of the input interface logic stage 32 is to interpret or decode the address lines and control lines within the control bus 14 to determine if the CPU 12 is trying to get the attention of the subsystem of FIG. 2. For example, if the CPU 12 is trying to access a peripheral device at 18 in FIG. 1, then such signals will be ineffective to act upon the logic stage 32. If on the other hand, these address and data signals were used to configure the RAM control output logic stage 52, then the input interface logic stage 32 would decode these signals. The input interface logic stage 32 is also operable to generate a strobe or clock signal on its output line 34 to latch input data received on line 56 into either the start address register 44, the row selection register 46, or the timer stage 48.

The start address register 44 is operative to identify the beginning portion of the RAM 24 that is to be refreshed. The particular subsystem implementation shown in FIG. 2 is set up so that we can enable and refresh any portion or segment of the RAM in the RAM array 24. In defining this portion of RAM to be refreshed, there is defined a beginning row of sequential addresses in register 44, and a number of subsequent addresses or rows which are to be refreshed. The row selection register 46 will hold the number of rows to be refreshed beginning with the start row identified by the start address register 44. Therefore, this is how we define the block of memory within the RAM array 24 that is to be refreshed and made available to the CPU 12.

The timer stage 48 is used to specify the refresh frequency at which we will perform a refresh cycle for the RAM 24. However, it will be understood to those skilled in the art that the timer stage 48 may be an integral part the CPU 12 and thus not necessarily embodied as a separate stage 48 as shown in the subsystem of FIG. 2.

The address increment counter stage 82 is used to generate the actual row address signals, so that the starting row of this address is provided on line 84 as an output from the start address register 44. Thus, the counter stage 82 will count up to the number of rows which were loaded into the row selection register 46. For example, if the starting row of RAM was row number 128 and the number of rows loaded into the row selection register was 64, then the address increment counter 82 will count up to 128 plus 64 or to row 192. And, the address increment counter 82 increments the address once every refresh cycle of the timer 48, so that there is a refresh cycle performed on the first address row, and each row between row 128 and row 192 will be refreshed at the refresh frequency of the signal on line 78 received from the output of the timer 48 and applied as input 80 to the address increment counter 82. Then, once the row counter 88 indicates that the row address increment process has been stepped through to row 92, the process repeats itself. This row counting is also controlled by the number of rows which are shifted from the row selection register 46 and by way of line 86 as multiple input into the row counter 88. At this point, the row counter 88 having reached zero (0) will now reload the number of rows into the row selection register 46 and then count down again. The starting row stored in the start address register 44 is again shifted by way of line 84 into the address increment counter 82 and the cycle starts all over again. Also, the frequency of counting in both the address increment counter 82 and the row counter 88 is controlled by the output control signals on lines 68 and 78 from the timer stage 48.

The address buffer and multiplexer stage 76 is used to determine the source of the address to the RAM 24. The source of the address to the RAM 24 is either an input from the refresh address generator 104 or a RAM access address data signal received on input line 106. The line 106 is also part of the address portion of the CPU control bus 14. When the CPU 12 wants to write directly into the RAM 24, the input interface logic stage 32 will see the address from the CPU 12 and will first determine whether it is a read cycle or a write cycle, or refresh cycle. If it is a read cycle or a write cycle, it will cause data on line 106 to be passed through the output buffer and multiplexer stage 76 and by way of line 26 directly into the RAM 24. In addition, the count signal on line 68 and applied via input 74 to the output multiplexer stage 76 can operate to force the stage 76 to receive data from either the address lines 106, the output 90 of the address increment counter 82. The RAM access address line 106 may in fact comprise 20 bits or 20 address lines, only ten (10) of which may be selected by the address buffer and multiplexer stage 76 for further processing on the multiple data line output connection 26 from the output multiplexer stage 76.

The RAM control output logic stage 52 is operative to generate the row access strobe or RAS signals and column access strobe or CAS signals on the multiple output lines 28 connected to the RAM 24. The multiple line 28 also conducts the write enable and the output enable signals which would be the minimum number of output data signals for a dynamic random access memory stage 24. When the timer 48 triggers and indicates that it is now time for a new refresh cycle, the RAM control output logic 52 will then respond to the input data on line 72 and thus generate row and column strobe signals on line 28 and applied to refresh the selected number of rows and columns of the RAM 24. For example, the row to be refreshed will be indicated on line 90 and processed through the address buffer and multiplexer stage 76 and then applied by way of data bus 26 as multiple inputs to the RAM 24. Then, the RAS and CAS strobe signals at the output of the RAM control output logic 52 provide the actual cell, the output of stage 52 provides the actual control for the refreshing in the RAM 24.

On the other hand, if the CPU 12 merely wants to read data from the RAM 24, then the output multiplexer stage 76 will allow this to take place by interconnecting the address line 106 through to the input 26 to the RAM 24 for this purpose. During this time, the timer stage 48 will not enable any refresh operation to occur. Also at this time, the signal on line 50 from the input interface logic 32 will signal the RAM control output logic stage 52 that this is a CPU read request and the output logic stage 52 will provide the actual control for reading the RAM 24. Specifically, the output stage 76 will generate the row read information on line 26 to the RAM 24, and then the row access strobe (RAS) output signal on line 28 from the output stage 52 will latch this row data into the RAM 24. Then, the address buffer and multiplexer stage 76 will pass the other portion of the address on line 106 to the RAM 24, followed by the application of the column access strobe signals on line 28 which will latch this column select data into the RAM stage 24. Thus, the RAS and CAS control signals or strobe signals at the output data line 28 from the RAM control output logic 52 thus activate the row and column location in the RAM 24 desired to be read by the CPU 12 and connected via line 106, output stage 76 and data line 26 to the RAM 24. Thus, the RAS and CAS signals on line 28 provide the activation signals for the rows and columns selected for address by outputs signals from stage 76. The particular row and column cell locations being read or written into are looked at only in point of time when the RAS and CAS strobe signals go low or to a low logical voltage level. Typically, the RAS signals will go low first to determine which row is to be activated as defined by the data output on line 26, followed by CAS signals on line 28 going low to determine which column in RAM is to be activated for the time that both RAS and CAS are at these low logical levels. When the refresh address generation block 104 in FIG. 2 is provided on the RAM chip 24 itself in an alternative embodiment of the invention, then the specific register that the CPU 12 may be programming (e.g. 44, 46, or 48), will still be determined by the address on line 26 rather than have the input interface logic 32 decode this information from the control bus 14.

By way of example to describe the operation of the RAM control subsystem 22 shown in FIG. 2, assume that the RAM memory 24 in FIG. 1 is a one megabyte DRAM having 512 rows of storage cells therein, but that for a particular software application, only 100 rows are required for storing data. Therefore, since we need only 100 memory cell rows to be periodically refreshed, the number 100 will be read and stored in the row number selection register 46 by data received on input line 60 thereto from either the interface logic 32 or the data bus 56 from the CPU 12. This process will begin upon receipt of input data on line 56 to the start address register 44 which operates to preset the address increment counter 82. Subsequently, the row counter 88 which is connected to the output data line 86 from the row number selection register 46 will count down from one-hundred (100) to zero (0) and then start all over again.

At the same time, however, the output data line 68 from the timer 48 controls the refresh frequency of the row selection process by means of data applied via line 68 and via line 80 as one input to the address increment counter 82. Thus, when the row counter 88 counts from one hundred (100) down to zero, the number of rows (100) from the row selection register 46 is again reloaded via line 86 into the row counter 88. The address increment counter 82 is then again reset with an initial value from the register 44.

As the row counter 88 goes from a count of 100 to 99, the address increment counter 82 will begin counting from the preset value from the start address register 44 up to 1 plus the preset value from register 44, and so on until the row counter 88 counts down to zero to cause the address increment counter to count up to 100 plus this preset value from register 44 and thereby refresh 100 of the 512 rows in the 1 megabyte DRAM. Then, the number 100 is reloaded in the row counter 88 and the above process starts all over again with the address increment counter 82 counting up to 100 while being frequency controlled by the frequency of the timer refresh signal on output lines 68 and 80. During this operation, the address increment counter 82 will operate to refresh each of the 100 rows in the DRAM stage 24 at a refresh interval of every 8 milliseconds.

The RAM control logic interface output stage 52 will generate a row address strobe (RAS) signal and a column address strobe (CAS) signal on its multiple output lines 28, so that in the RAM cell array in the RAM memory 24 using a one megabyte DRAM, there are required 20 address lines or, alternatively, 10 address lines operating so that the row address strobe (RAS) signals are generated first on output lines 28 followed by the generation of the column access strobe (CAS) signals thereon to the row and column access lines (not shown), respectively, feeding into the DRAM memory stage 24. These address lines will be required to refresh 100 rows of memory in the RAM 24, and for CPU access of the RAM 24.

The RAM control logic output stage 52 is driven by the two input data lines 72 and 96 as shown to generate the row access strobe and column access strobe signals on line 28 in response to a low power mode signal on line 92 feeding line 96 and also in response to a timer output signal on line 68 feeding line 72 to the RAM control logic stage 52. However, the RAM access request line 50 which is connected directly between the output of the logic interface input stage 32 and another input 102 to the RAM control logic 52 is also operative to directly generate the row access strobe signals and column access strobe signals on line 28, thereby bypassing completely the row count and refresh address generation circuitry 104 for CPU initial RAM cycles.

Referring now to the address buffer and multiplexer stage 76, the output address lines 26 from this stage are also connected to the RAM memory 24, and the multiplexer stage 76 is driven by a RAM access address line 106, the data on which may be utilized to directly provide an address to the RAM memory 24 from the CPU bus 14 for any CPU initiated access rather than from line 90 for a RAM control initiated refresh cycle.

Referring again to FIG. 2, the address buffer multiplexer stage 76 is connected to receive low power mode data on line 92 which in turn is operative, for example, to control the output current drive requirements of the multiplexer stage 76 and thus reduce the output current drive of this stage when the system is to be operating in a low power or "sleep" mode. The address multiplexer stage 76 is also connected to receive RAM access address data on line 106 will typically be divided down by the buffer stage 76 before being applied to the RAM storage stage 24.

Referring again to the refresh address generation circuitry 104 in FIG. 2, assume that the circuitry 104 has been in operation for a time sufficient to continuously refresh a predetermined fraction of the total number of cell rows in the RAM memory 24 in FIG. 1. The system in FIG. 1 has now come up to full operating condition and level, and let us assume that the central processing unit 12 now decides that it requires more or less RAM capacity in the RAM memory stage 24. There is shown only a single central processing unit 12 in the functional block diagram of FIG. 1 for commanding this change, but there could be a large number of the CPU units 12 connected as shown to the common output data bus 14 in this system. Assume also, for example, that the user wants to run a particular software application such as a word processing operation requiring a relatively low level of RAM capacity or, alternatively, a spreadsheet program requiring a relatively large amount of RAM capacity in the RAM memory 24.

Now, assuming in this particular example that the user has in fact launched a particular spreadsheet application and that when the central processing unit (CPU) 12 reads the existing amount of capacity in the RAM memory 24 via the bidirectional data on lines 14, 30, 56, and 60, the CPU 12 is informed that more RAM capacity will be required for this particular spreadsheet software application. The CPU 12 then accesses the RAM control stage 22, and by operation of the refresh address generation circuitry 104 in FIG. 2, increases the number of cell rows in the RAM memory 24 which need to refreshed at the refresh frequency of the timer 48.

During system start-up in FIG. 1 in a typical start-up operation, a read-only-memory (ROM) stage 16 will be connected as shown to the data bus 14 and will provide input data via line 30 to the RAM memory 24 for controlling the start-up operation of the system. Typically, when the RAM stage 24 has been in a sleep or standby mode with a low level of power applied thereto, there will normally be little active memory in the RAM 24 and the ROM 16 will be called upon to provide a certain amount of start up memory for the RAM 24 as is well-known Thus, when the central processing unit (CPU) 12 begins the start-up operation of the system shown in FIG. 1, it calls upon the ROM 16 to provide initialization software to configure the RAM 24 as well as to provide activation of peripheral interface equipment 18 such as printers, disk drives, tape drives, modems and the like.

The CPU 12 will also read the permanently coded software program in the ROM 16, which is a basic program that sets the initial operating condition for the system 10 in FIG. 1, and in effect, defines what the system is. The CPU 12 will also typically operate to read the ROM 16 and move its data into the RAM 24 whose access times are faster than the ROM access times. Thus, with no data stored in the RAM 24, the CPU 12 gets its initial instructions from the data permanently stored in the ROM 16, so that the first time the system is powered up, the CPU 12 will obtain its instructions from the ROM 16, and the ROM 16 responds and tells the CPU 12 how to now configure the RAM control circuitry 22 during system start-up. In addition to its start-up control function as described above, the ROM 16 will typically have a certain amount of dedicated code permanently stored therein which is repetitively used during the operation of the system 10 shown in FIG. 1 and is thus available to the CPU 12 on the same basis as the memory and data stored in the RAM memory 24.

In a portable computer type of environment, the power supply 20 may, for example, supply power to the entire computer operating system 10 or to only certain sections thereof. Thus, if it is preferred to be operating in a low power mode, certain portions in the system 10 could be turned completely off, with the power supply 20 now providing power to only those portions of the system that need to stay awake during the sleep or stand-by modes of operation.

In a typical system configuration of the type shown in FIG. 1, the RAM stage 24 might, for example, have a typical data storage capacity of 4 megabytes of RAM, where each megabyte is contained on a 1 megabyte single in-line memory module (SIMM). Then, each 1 megabyte SIMM will have a plurality of 1 megabit DRAM chips on it. So that, for example, there might be eight (8) separate one megabit DRAM chips on each SIMM, with the 4 SIMMs constituting the 4 megabyte RAM block 24. Now, in accordance with an alternative embodiment of this invention, each one of these DRAM chips can be constructed to have the refresh address generation circuitry 104 as an integral part thereof. But in this embodiment, there will still need to be the RAM control output logic stage 52 and the address buffer multiplexer stage 78 connected as shown in FIG. 2 for generating the data otherwise generated by these output stages on lines 26 and 28 for RAM cycles initiated by the CPU 12 or by a peripheral device 18.

For example, there could be a pin on each of the above proposed individual RAM chips which might be brought to a low voltage level (low). The RAM chip is then accessed to tell each chip that a certain number of rows therein need to be refreshed. Thus, in this example, each DRAM chip might have on-board circuitry associated with each of the registers 44 and 46, the timer 48, and the counters 82 and 84 which are now all on-chip for each of the individual DRAM chips in the RAM stage 24. Thus, the RAM stage 24 now can be accessed directly via line 30 in FIG. 1 by the central processing unit 12 as described above. In this alternative embodiment of the invention, it is possible to dedicate one pin per chip that is to be used to place the chip in a special mode that will enable the CPU 12 to write to the storage elements of stages 44, 46, and 48 to thereby configure the refresh address generation subsystem 104. The element selected by this process would be determined by the address presented to the RAM 24 from lines 106, 14, and 26.

Thus, the refresh address generation on-chip circuitry will tell each chip how many rows of memory are to be refreshed and at what refresh frequency in the same manner as described above with reference to the off-chip case. Then, the special RAM control pin on each RAM could then be brought back to a high voltage level (high) again and the DRAM chips will now continue to perform its own refresh operation without any further intervention from the central processing unit 12. In addition, the CPU unit 12 can now access the RAM stage 24 just as normal RAM and without going through any RAM control stage 22 as shown in FIG. 1 except as may be required for address multiplexing as is common for DRAMs. However, this connection could be removed in the case where the present invention is used in an application to support an enhanced pseudo-static DRAM architecture. The pseudo-static DRAM architecture is a DRAM that looks and performs like a static random access memory (SRAM) and thus does not need to be refreshed. In this architecture, you do not need the output stages 52 and 76 and the address lines such as 106 in Figure would connect directly in pins on the SRAM chip. Here you would have write, read, and control lines connected directly to the RAM chip. Alternatively, however, the RAM control stage 22 can still generate refresh requests to the individual RAM chips in the RAM memory 24. This operation, for example, might be in the form of column access strobe (CAS) before row access strobe (RAS) refresh signals of the type generated on line 28 in FIG. 2 if a timer circuit 48 were not included in the subsystem 104.

Advantageously, the novel system described above may also be used with portable read-only-memory or ROM cards 16 which have certain different types of software programs permanently stored therein. For example, one such ROM card 16 might have text editing software stored therein, another such portable ROM card might have a drawing program stored therein, and yet another ROM card might have a video game stored therein. A selected ROM card 16 can then be plugged in at the bus line 14 shown in FIG. 1 and then read by the central processing unit 12 to see how much memory is going to be required for our exemplary text editing software as an example. The CPU 12 then operates to load the text editing software application at the portable ROM 16 into the RAM stage 24 and simultaneously allocates space in the RAM 24 for the text which is to be generated.

Then, a user will start typing in the text, and as the document begins to get longer, the CPU 12 may need to allocate more RAM in the RAM stage 24. In this application and example, the text editing software and data retention memory required for the RAM 24 may be typically only be about 1% of the total RAM storage capability of the entire memory 24. Thus, in this application, rather than powering up the entire RAM stage 24, we need only to power up 1% of the RAM capacity thereof, thereby providing a corresponding 99% power saving for refresh cycles with respect to the prior art described above. Then, the first, text editing portable ROM card 16 in our example may be removed from the location indicated at the data bus 14 in FIG. 1 and replaced with a video game ROM card or a drawing program ROM card which require larger amounts of data storage capacity for these other two exemplary software applications.

Another example of a typical situation wherein controlled and selective refresh cycling in accordance with the present invention has significant utility is in the case of small portable computers used in business travel. A traveller may, for example, chose to use his portable computer during travel to generate a several page document and, upon completion, then put his computer in the sleep mode until he reaches his destination and is able to transfer the contents of the document to hardcopy. Thus, he is now able to switch the appropriate controls on the portable computer to thereby turn off the visual display thereof and other power to certain ones of the computer components, while refreshing only those rows of memory that contain the stored document Again, this operation substantially reduces power drain and power requirements on the personal computer during the time it is not being used by the business traveller.

Various modifications may be made in and to the above described embodiments without departing from the spirit and scope of this invention. For example, in the RAM control system 22 shown in FIG. 2, the various registers, counters, and timer within the refresh address generation section 104 of the control system may be connected in various and different ways in order to generate the proper power levels and frequency of refresh signals which are ultimately processed through the buffer multiplexer stage 76 and the output RAM control logic 52 to thereby control refresh cycling in the RAM stage 24. In addition, when the refresh address generation section 104 of the DRAM control system 22 is moved onto the RAM chips in the RAM stage 24, the various register, counter, and timer stages may be laid out in many different types of integrated circuit structural configurations in order to provide the desired on-chip refresh cycling and function as described above. Accordingly, these and other similar design modifications are clearly within the scope of the following appended claims.

I claim:

1. A method for conserving power during the operation of a personal computer having a certain amount of random access memory (RAM) therein defined by a predetermined number of rows of memory elements or cells located on a single RAM semiconductor chip, said method comprising the steps of:
   a. reading a computer program to ascertain how much RAM memory is required thereby, and
   b. refreshing a selected fraction or subset of the total number of rows in a single RAM memory chip as required by said computer program in above, but less than the total number of rows of elements or cells in one or more RAM memory chips in order to conserve power, and
   c. refreshing at a controlled refresh frequency corresponding to an operational power level sufficient to prevent any within any of said selected rows in said RAM memory from losing data stored therein.

2. The method defined in claim 1 which further includes the steps of:
   a. reading another computer software program to ascertain how much RAM memory is required thereby, and
   b. refreshing another selected fraction or subset of the total number of rows in said single RAM memory chips as required by said another computer program in addition to the fraction or subset of the total number of rows required by the first computer program and at a controlled refresh frequency corresponding to an operational power level sufficient to prevent any cell within said second number of selected rows in said RAM memory from losing data stored therein.

3. The method defined in claim 1 which further includes:
   a. reading said computer program and thereby determining the number of rows of said memory elements or cells in said RAM necessary for the retention of data therein when said computer is operating in a standby mode, and
   b. refreshing the determined number of rows at a controlled refresh frequency and power level necessary to retain data in said determined number of rows until said computer is brought out of said standby mode.

4. A system for conserving power in the operation of a personal computer having a certain amount of random access memory (RAM) therein defined by a certain number of rows of memory elements or cells located on a single RAM semiconductor chip, said system comprising:
   a. means for reading a computer program to ascertain how much RAM memory is required thereby, and
   b. means connected to said reading means for refreshing a selected fraction or subset of the total number of rows in a single RAM memory chip required by said computer program, but less than the total number of rows of elements or cells in one or ore of RAM memory chips n order to conserve power, and at a controlled refresh frequency corresponding to an operational power level sufficient to prevent any cell within any of said selected rows in said RAM memory chip from losing data stored therein.

5. The system defined in claim 4 which further includes:
   a. means for reading another computer software program to ascertain how much RAM memory is required thereby, and
   b. means connected to said reading means for refreshing another selected fraction or subset of the total number of rows in a single RAM memory chip as required by said another computer program in addition to the fraction or subset of the total number of rows required by the first computer program and at a controlled refresh frequency corresponding to an operational power level sufficient to prevent any cell within said another selected number of selected rows in said RAM memory chip from losing data stored therein.

6. The system defined in claim 4 which further includes:
   a. means for reading a computer program and thereby determining the number of rows of said memory elements or cells in said RAM necessary for the retention of data therein when said computer is operating in a standby mode, and
   b. means connected to said determining means for refreshing the determined number of rows at a controlled refresh frequency and power level necessary to retain data in said determined number of rows until said computer is brought out of said standby mode.

7. A computer system operative for refreshing certain percentage of RAM memory capacity on a required use basis, and further operative for changing said percentage of RAM memory upon changing to a different software application, said system including, in combination:
   a. a central processing unit,
   b. a random access memory (RAM) stage comprising a RAM memory chip having a certain number of rows of memory elements or cells therein, and
   c. random access memory (RAM) control means connected between said central processing unit and said random access memory stage and responsive to input data signals received from said central processing unit for refreshing a selected fraction or subset of the total number of rows of memory elements or cells within said RAM stage, but less than the total number of rows of elements or cells in one or more RAM memory chips within said RAM storage in order to conserve power, as a function of memory storage capacity requirements for a software program used by said central processing unit.

8. The system defined in claim 7 which further includes means for receiving a portable read-only-memory (ROM) card which is connected to said random access memory stage so that data from said read-only-memory card may be loaded into said random access memory stage during start-up of said computer system.

9. The system defined in claim 7 wherein said random access memory control means includes:
   a. an interface input logic stage connected to receive input data from said central processing unit,
   b. a start address register and a row number selection register connected to the output of said interface input logic stage for storing the number of rows of memory elements or cells within said RAM stage to be refreshed, c. a timer stage connected to the output of said interface input logic stage for controlling the refresh frequency for said RAM stage, and d. an address increment counter and a row counter each connected to the outputs of said start address register and said row number selection register, respectively, for generating output data for refreshing said RAM state, whereby said registers, timer, and counters defined in paragraphs b., c., and d. herein may be fabricated on the same semiconductor chip that contains random access memory within said RAM state.

10. The system defined in claim 9 which further includes:

a. an output address buffer and signal multiplexing stage connected to the output of said address increment counter for providing an output data stream for application to said RAM stage, and b. a RAM control output logic stage connected to receive low power mode signals and output data from said input logic interface stage for generating row access strobe (RAS) signals and column access strobe signals (CAS) for application to said RAM stage, whereby said RAM semiconductor chip may be either read, written into, or refreshed.

11. The computer system defined in claim 10 which further includes means for receiving portable read-only-memory (ROM) cards each having stored therein a known software program and connected to both said central processing unit and to said random access memory stage for loading data into said RAM stage.

* * * * *